United States Patent
Song

(10) Patent No.: US 9,059,338 B2
(45) Date of Patent: Jun. 16, 2015

(54) LIGHT EMITTING ELEMENT AND A PRODUCTION METHOD THEREFOR

(75) Inventor: June O Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1034 days.

(21) Appl. No.: 12/990,398

(22) PCT Filed: May 4, 2009

(86) PCT No.: PCT/KR2009/002352
§ 371 (c)(1),
(2), (4) Date: Mar. 1, 2011

(87) PCT Pub. No.: WO2009/134109
PCT Pub. Date: Nov. 5, 2009

(65) Prior Publication Data
US 2011/0163294 A1 Jul. 7, 2011

(30) Foreign Application Priority Data

May 2, 2008 (KR) .................. 10-2008-0041097
May 2, 2008 (KR) .................. 10-2008-0041102
May 2, 2008 (KR) .................. 10-2008-0041105

(51) Int. Cl.
| | |
|---|---|
| H01L 29/06 | (2006.01) |
| H01L 33/00 | (2010.01) |
| H01L 33/14 | (2010.01) |
| H01L 33/16 | (2010.01) |
| H01L 33/32 | (2010.01) |

(52) U.S. Cl.
CPC ............ *H01L 33/0066* (2013.01); *H01L 33/14* (2013.01); *H01L 33/16* (2013.01); *H01L 33/32* (2013.01)

(58) Field of Classification Search
CPC ........................................ H01L 33/32
USPC .................. 438/1; 257/13, 94, E33.008
See application file for complete search history.

(56) References Cited

U.S. PATENT DOCUMENTS

| | | | |
|---|---|---|---|
| 7,897,993 B2 | 3/2011 | Ono et al. | ........ 257/103 |
| 2002/0160539 A1* | 10/2002 | Yamada et al. | ........ 438/1 |
| 2004/0041161 A1 | 3/2004 | Kim | ........ 257/80 |
| 2004/0046166 A1 | 3/2004 | Cho et al. | ........ 257/13 |

(Continued)

FOREIGN PATENT DOCUMENTS

| | | |
|---|---|---|
| CN | 1482687 A | 3/2004 |
| CN | 101010812 A | 8/2007 |

(Continued)

OTHER PUBLICATIONS

KR1020050073336A Korean Patent Publication.*

(Continued)

*Primary Examiner* — Dale E Page
(74) *Attorney, Agent, or Firm* — Ked & Associates, LLP

(57) ABSTRACT

Disclosed are a light emitting device and a method of manufacturing the same. The light emitting device includes a support substrate, a wafer bonding layer on the support substrate, a current spreading layer on the wafer bonding layer, a second conductive semiconductor layer on the current spreading layer, an active layer on the second conductive semiconductor layer, a first conductive semiconductor layer on the active layer, a surface modification layer on the first conductive semiconductor layer, and a first electrode layer on the surface modification layer.

22 Claims, 2 Drawing Sheets

(56) References Cited

U.S. PATENT DOCUMENTS

| | | | |
|---|---|---|---|
| 2005/0236032 A1* | 10/2005 | Aoki | 136/252 |
| 2007/0018177 A1 | 1/2007 | Lee et al. | 257/94 |
| 2007/0063207 A1* | 3/2007 | Tanizawa et al. | 257/94 |
| 2008/0093618 A1 | 4/2008 | Lee et al. | 257/98 |
| 2008/0230792 A1 | 9/2008 | Jiang et al. | 257/94 |
| 2010/0308366 A1* | 12/2010 | Kang et al. | 257/99 |

FOREIGN PATENT DOCUMENTS

| | | |
|---|---|---|
| EP | 1 385 215 A2 | 1/2004 |
| JP | 11-340509 | 12/1999 |
| KR | 10-2001-0000545 A | 1/2001 |
| KR | 10-0706952 | 4/2007 |
| KR | 10-0815225 | 3/2008 |
| WO | WO 2007/048345 | 5/2007 |

OTHER PUBLICATIONS

Chinese Office Action dated Sep. 26, 2012 issued in Application No. 200980115885.7.

European Search Report dated Oct. 31, 2012 issued in Application No. 09 73 9015.

Korean Office Action dated Mar. 28, 2014 issued in Application No. 10-2008-0041097.

Korean Office Action dated Mar. 28, 2014 issued in Application No. 10-2008-0041105.

International Search Report issued in PCT/KR2009/002352 dated Dec. 28, 2009.

European Search Report issued in related Application No. 09 739 015.7 dated Sep. 19, 2014.

* cited by examiner laser beam

LIGHT EMITTING ELEMENT AND A PRODUCTION METHOD THEREFOR

CROSS-REFERENCE TO RELATED PATENT APPLICATIONS

This application is a U.S National Stage Application under 35 U.S.C. §371 of PCT Application No PCT/KR2009/002352, filed May 4, 2009, which claims priority to Korean Patent Application Nos. 10-2008-0041097, filed May 2, 2008, 10-2008-0041102, filed May 2, 2008, and 10-2008-0041105 filed May 2, 2008, whose entire disclosures are hereby incorporated by reference.

TECHNICAL FIELD

The present invention relates to a light emitting device and a method of manufacturing the same.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED includes a light emitting device semiconductor layer including a first conductive semiconductor layer, an active layer and a second conductive semiconductor layer, in which the active layer generates light according to current applied to the first and second conductive semiconductor layers.

Meanwhile, the LED may be grown from a sapphire growth substrate, and the light emitting semiconductor layer is placed on c (0001) planes vertically crossing each other about a crystal c-axis of the sapphire growth substrate. Symmetry elements contained in a wurtzite crystal structure represents that the single crystal of a group III nitride-based semiconductor has spontaneous polarization along the c-axis. In addition, if the wurtzite crystal structure is non-centrosymmetric crystal structure, single crystals of group III nitride-based semiconductor may additionally represent piezoelectric polarization.

Recently, the growth technology of the single crystal of the group III nitride-based semiconductor employs single crystals of a group III nitride-based semiconductor terminated with a group 3-metal polar surface and grown in a c-axis direction. In other words, when the single crystals of the group III nitride-based semiconductor are grown by MOCVD or HVPE growth equipment, a surface making contact with air represents a group-III metallic polarity, and a surface making contact with the sapphire substrate serving as a growth substrate represents a nitrogen polarity.

Accordingly, if the same electrode material, that is, Ti/Al is stacked on both of the surface of a gallium nitride having a gallium polarity belonging to group-III metal and the surface of a gallium nitride having a nitrogen polarity, contacting interfaces represent different behaviors according to heat treatment temperatures.

Meanwhile, the LEDs are classified into a lateral-type LED and a vertical-type LED. In the lateral-type LED, a first electrode layer is formed on a first conductive semiconductor layer having a group-III metallic polarity surface. In the vertical-type LED, the first electrode layer is formed on the first conducive semiconductor layer having a nitrogen polarity.

Accordingly, when a first electrode layer is formed in the vertical-type LED similarly to the lateral-type LED, a superior ohmic contacting interface cannot be formed, and high driving voltage drop occurs, so that a great amount of heat may be emitted and the life span of the LED may be reduced.

DISCLOSURE

Technical Problem

The embodiment provides a light emitting device having a novel structure and a method of manufacturing the same.

The embodiment provides a light emitting device capable of improving electrical characteristics and a method of manufacturing the same.

Technical Solution

According to the embodiment, the light emitting device includes a support substrate, a wafer bonding layer on the support substrate, a current spreading layer on the wafer bonding layer, a second conductive semiconductor layer on the current spreading layer, an active layer on the second conductive semiconductor layer, a first conductive semiconductor layer on the active layer, a surface modification layer on the first conductive semiconductor layer, and a first electrode layer on the surface modification layer.

Advantageous Effects

The embodiment can provide a light emitting device having a novel structure and a method of manufacturing the same.

The embodiment can provide a light emitting device capable of improving an electrical characteristic and a method of manufacturing the same.

BEST MODE

[Mode for Invention]

Figure 1:
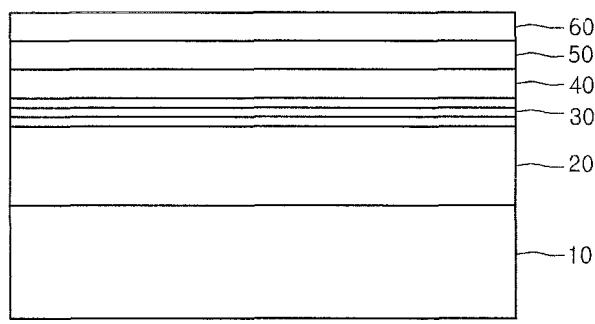
FIGS. 1 to 5 are sectional views showing a light emitting device and a method of manufacturing the same according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIGS. 1 to 5 are sectional views showing a light emitting device and a method of manufacturing the same according to the embodiment.

Referring to FIG. 1, a light emitting semiconductor layer including a first conductive semiconductor layer 20, an active layer 30, and a second conductive semiconductor layer 40 is formed on a growth substrate 10, and a current spreading layer 50 and a first wafer bonding layer 60 are formed on the second conductive semiconductor layer 40.

For example, the growth substrate 10 may include one selected from the group consisting of $Al_2O_3$, SiC, Si, AlN, GaN, AlGaN, glass, and GaAs.

Although not shown in the drawings, a buffer layer may be formed between the growth substrate 10 and the first conductive semiconductor layer 20. The buffer layer is formed on the growth substrate 10 to improve lattice match between the growth substrate 10 and the first conductive semiconductor layer 20. For example, the buffer layer may include at least one selected from the group consisting of InGaN, AlN, SiC, SiCN, and GaN.

The light emitting semiconductor layer may be formed on the buffer layer through single crystal growth schemes such as MOCVD and MBE. For example, the first conductive semiconductor layer 20 may include a GaN layer or an AlGaN layer doped with Si, Ge, Se, or Te. The active layer 30 may include an undoped InGaN layer and an undoped GaN layer, and the second conductive semiconductor layer 40 may include a GaN layer or an AlGaN layer doped with Mg, Zn, Ca, Sr, or Ba.

The light emitting semiconductor layer has a surface having a nitrogen polarity in opposition to the growth substrate 10, and has a surface having a metallic polarity in opposition to the current spreading layer 50.

The current spreading layer 50 may include a material, such as Al, Ag, or Rh, representing 70% or more of a reflectance in a wavelength band of 600 nm or less.

The current spreading layer 50 forms an ohmic contacting interface with respect to the second conductive semiconductor layer 40, so that current can be easily injected in a vertical direction.

The first wafer bonding layer 60 is formed on the current spreading layer 50, and may include a material, such as Au, Ag, Cu, Pt, Pd, or Al, representing superior thermal conductivity and strong mechanical bonding strength.

Although not shown, a superlattice structure layer may be formed between the second conductive semiconductor layer 40 and the current spreading layer 50.

The superlattice structure layer forms an ohmic contacting interface with respect to the second conductive semiconductor layer 40 so that current can be easily injected in a vertical direction. The superlattice structure layer may increase the effective concentration of holes by reducing dopant activation energy of the second conducive semiconductor layer 40, or may cause a quantum mechanical tunneling conductivity through band-gap engineering.

The superlattice structure layer may have a multi-layer structure including a nitride or a carbon nitride including group II, III, or IV elements. Each layer constituting the superlattice structure layer may have a thickness of about 5 nm or less. Each layer constituting the superlattice structure layer may include at least one selected from the group consisting of InN, InGaN, InAlN, AlGaN, GaN, AlInGaN, AlN, SiC, SiCN, MgN, ZnN, and SiN, and may be doped with Si, Mg, or Zn. For example, the superlattice structure layer may have a multi-layer structure such as InGaN/GaN, AlGaN/GaN, InGaN/GaN/AlGaN, or AlGaN/GaN/InGaN.

In addition, the superlattice structure layer may have a single layer structure. For example, the superlattice structure layer may include an InGaN layer, a GaN layer, an AlInN layer, an AlN layer, an InN layer, an AlGaN layer, or an AlInGaN layer doped with N type impurities, or may include an InGaN layer, a GaN layer, an AlInN layer, an AlN layer, an InN layer, an AlGaN layer, or an AlInGaN layer doped with P type impurities.

Figure 2:
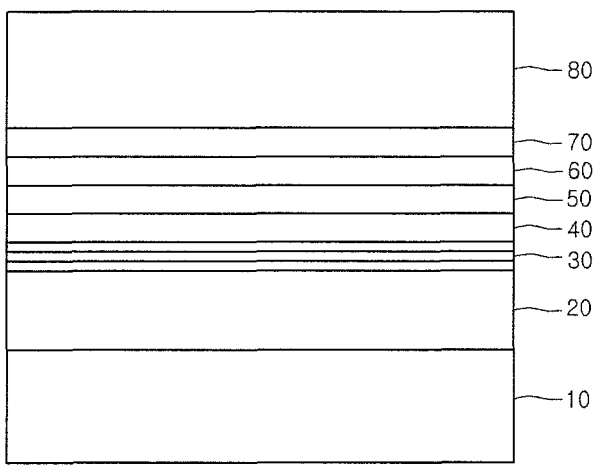

Referring to FIG. 2, a support substrate 80 having a second wafer bonding layer 70 is bonded to an upper portion of the first wafer bonding layer 60.

After preparing the support substrate 80, the second wafer bonding layer 70 is formed on the support substrate 80, and then bonded to the first wafer bonding layer 60. The second wafer bonding layer 70 may be omitted, or the support substrate 80 may be directly bonded on the upper portion of the first wafer bonding layer 60.

Similarly to the first wafer bonding layer 60, the second wafer bonding layer 70 may include a material, such as Au, Ag, Cu, Pt, Pd, Al, representing superior thermal conductivity and strong mechanical bonding strength.

The support substrate 80 may include at least one selected from the group consisting of $Al_2O_3$, SiC, Si, GaAs, Cu, Ni, NiCu, NiCr, Nb, Au, Ta, Ti, and metallic silicide.

Figure 3:
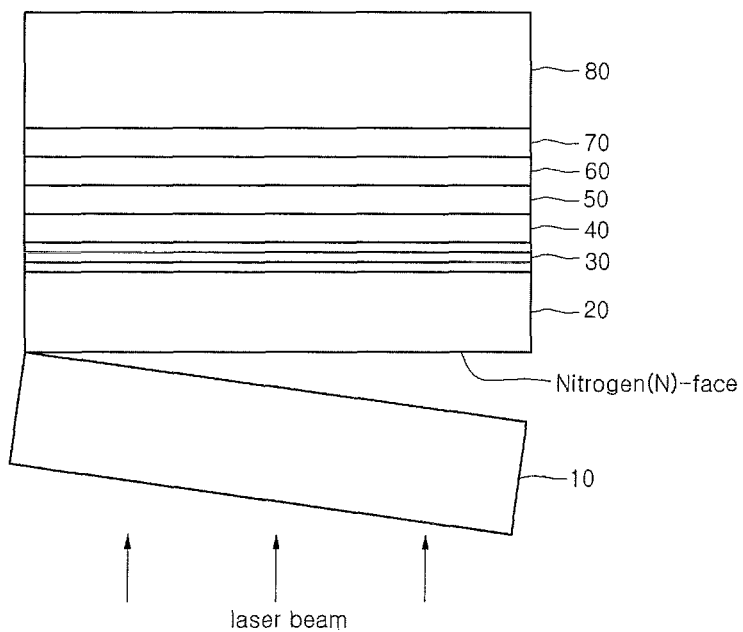
Figure 4:
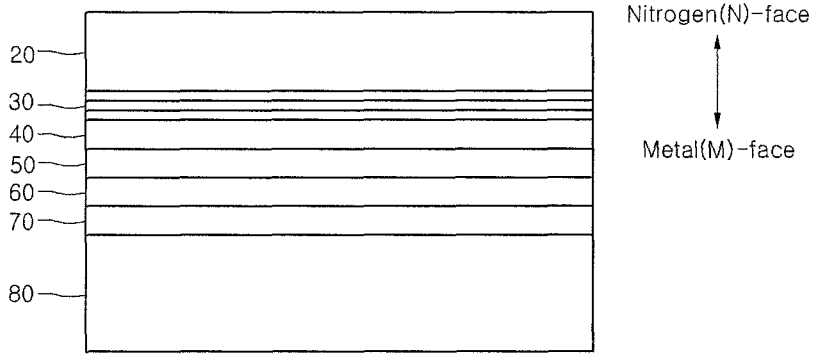

Referring to FIGS. 3 and 4, the growth substrate 10 is separated from the structure of FIG. 2.

When the growth substrate 10 is separated from the structure of FIG. 2, the first conductive semiconductor layer 20 is exposed to the outside. In this case, the surface having a nitrogen polarity, that is, a nitrogen (N)-face of the first conductive semiconductor layer 20 is exposed.

Figure 5:
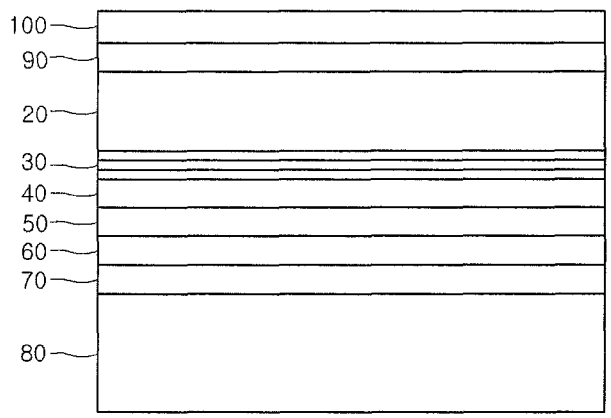

Referring to FIG. 5, a surface modification layer 90 is formed on the first conductive semiconductor layer 20 having the exposed surface of the nitrogen polarity, and a first electrode layer 100 is formed on the surface modification layer 90.

Although the surface modification layer 90 and the first electrode layer 100 are formed on the whole surface of the first conductive semiconductor layer 20 as shown in FIG. 5, the surface modification layer 90 and the first electrode layer 100 may be partially formed on the first conductive semiconductor layer 20

The surface modification layer 90 is formed on the surface having the nitrogen polarity of the first conductive semiconductor layer 20, so that the first electrode layer 100 may form an ohmic contacting interface.

According to a first embodiment, the surface modification layer 90 may include a metallic compound having a thickness of 5 nm or less. The metallic compound may include the compound of at least one selected from the group consisting of S, Se, Te, and F and at least one selected from the group consisting of In, Mg, Al, Ga, and La. For example, the surface modification layer 90 includes $In_2S_3$, and the first electrode layer 100 may have a stack structure of ITO/Cr/Al/Ni/Au.

According to the second embodiment, the surface modification layer 90 may include a metallic compound including Ga elements. The metallic compound may include one selected from the group consisting of Gallium-oxide, Ga—S, Ga—Se, and Ga—Te. For example, the surface modification layer 90 includes $Ga_2O_3$, and the first electrode layer 100 may have a stack structure of ITO/Cr/Al/Ni/Au.

According to the third embodiment, the surface modification layer 90 may include metal having an atomic radius greater than that of Ga, or may include the alloy or the solid solution including the metal having an atomic radius greater than that of Ga. The metal having an atomic radius greater than that of Ga may include Ge, Y, Zr, Nb, Mo, Fe, Tc, Ru, Rh, Pd, Ag, Cd, In, Sn, Sb, Lu, Hf, Ta, W, Re, Os, Ir, Pt, Au, Bi, or La-based metal. For example, the surface modification layer 90 may include Rh (Rhodium), and the first electrode layer 100 may have the stack structure of Cr/Al/Ni/Au.

The surface modification layer 90 and the first electrode layer 100 may be formed through E-beam deposition, PVD (physical vapor deposition), CVD (chemical vapor deposition), PLD (plasma laser deposition), dual-type thermal evaporator, or sputtering. For example, the surface modification layer 90 and the first electrode layer 100 may be formed under a condition of the temperature of about 20° C. to about 1500° C. and an atmosphere pressure to a pressure of $10^{-12}$ torr.

After the surface modification layer 90 and the first electrode layer 100 have been formed, a heat treatment process can be performed in a chamber. The heat treatment process may be performed under a condition of a temperature of about 100° C. to about 800° C. and a vacuum or gas atmosphere for 10 seconds to three hours. The gas introduced into the chamber may include at least one of nitrogen, argon, helium, oxygen, hydrogen, and air.

Therefore, the light emitting device according to the embodiment can be manufactured.

According to the light emitting device of the embodiment, the surface modification layer 90 is formed on the first conductive semiconductor layer 20 having a nitrogen polarity, so that a superior ohmic contacting interface can be formed. Accordingly, the electrical characteristic of the light emitting device can be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

[Industrial Applicability]

The embodiment is applicable to a light emitting device used as a light source.

The invention claimed is:

1. A light emitting device having a vertical-type light emitting diode structure comprising:
    a support substrate;
    a wafer bonding layer provided over the support substrate;
    a current spreading layer provided over the wafer bonding layer;
    a second conductive semiconductor layer provided over the current spreading layer;
    an active layer provided over the second conductive semiconductor layer;
    a first conductive semiconductor layer provided over the active layer;
    a surface modification layer provided directly on the first conductive semiconductor layer; and
    a first electrode layer provided over the surface modification layer,
    wherein the wafer bonding layer is formed of a metal layer,
    wherein the first conductive semiconductor layer is disposed between the active layer and the surface modification layer, and
    wherein the current spreading layer includes a metal material and is formed of a non-semiconductor.

2. The light emitting device of claim 1, wherein the first conductive semiconductor layer has a surface having a nitrogen polarity while being opposite to the surface modification layer.

3. The light emitting device of claim 1, further comprising a superlattice structure layer between the second conductive semiconductor layer and the current spreading layer.

4. The light emitting device of claim 3, wherein the superlattice structure layer has a multi-layer structure including nitride or carbon nitride including group II, III, or IV elements.

5. The light emitting device of claim 4, wherein the superlattice structure layer has a multi-layer structure including one of InGaN/GaN, AlGaN/GaN, InGaN/GaN/AlGaN, and AlGaN/GaN/InGaN.

6. The light emitting device of claim 1, wherein the wafer bonding layer includes a plurality of metal layers between the current spreading layer and the support substrate, and
    wherein the plurality of metal layers includes a first metal layer that contacts a bottom surface of the current spreading layer and a second metal layer that contacts a top surface of the support substrate.

7. The light emitting device of claim 6, wherein the wafer bonding layer includes at least one of Au, Ag, Al, Cu, Pd, and Pt.

8. The light emitting device of claim 1, wherein the current spreading layer includes at least one of Al, Ag, and Rh.

9. The light emitting device of claim 1, wherein the surface modification layer includes a compound of at least one of S, Se, Te, and F and at least one of In, Mg, Al, Ga, and La.

10. The light emitting device of claim 9, wherein the surface modification layer includes $In_2S_3$.

11. The light emitting device of claim 1, wherein the surface modification layer includes a metallic compound including Ga.

12. The light emitting device of claim 11, wherein the metallic compound includes one of a gallium oxide, Ga—S, Ga—Se, and Ga—Te.

13. The light emitting device of claim 1, wherein the surface modification layer is formed of a metal having an atomic radius greater than an atomic radius of Ga.

14. The light emitting device of claim 13, wherein the metal having the atomic radius greater than the atomic radius of Ga includes one selected from the group consisting of Ge, Y, Zr, Nb, Mo, Fe, Tc, Ru, Rh, Pd, Ag, Cd, In, Sn, Sb, Lu, Hf, Ta, W, Re, Os, Ir, Pt, Au, Bi, and La.

15. The light emitting device of claim 1, wherein the surface modification layer and the first electrode layer are disposed over a portion of the top surface the first conductive semiconductor layer.

16. The light emitting device of claim 1, wherein the surface modification layer is formed of alloy including a metal having an atomic radius greater than an atomic radius of Ga,
    wherein the metal having the atomic radius greater than the atomic radius of Ga includes one selected from the group consisting of Ge, Y, Zr, Nb, Mo, Fe, Tc, Ru, Rh, Pd, Ag, Cd, In, Sn, Sb, Lu, Hf, Ta, W, Re, Os, Ir, Pt, Au, Bi, and La.

17. The light emitting device of claim 1, wherein the surface modification layer is formed of a solid solution of a metal having an atomic radius greater than an atomic radius of Ga,
    wherein the metal having the atomic radius greater than the atomic radius of Ga includes one selected from the group consisting of Ge, Y, Zr, Nb, Mo, Fe, Tc, Ru, Rh, Pd, Ag, Cd, In, Sn, Sb, Lu, Hf, Ta, W, Re, Os, Ir, Pt, Au, Bi, and La.

18. The light emitting device of claim 1, wherein the first conductive semiconductor layer includes at least one selected from the group consisting of Si, Ge, Se, or Te doped therein.

19. The light emitting device of claim 18, wherein the second conductive semiconductor layer includes at least one selected from the group consisting of Mg, Zn, Ca, Sr, Ba doped therein.

20. The light emitting device of claim 1, wherein the surface modification layer has a thickness of 5 nm or less.

21. The light emitting device of claim 1, wherein the first electrode layer includes a plurality of metal layers.

22. The light emitting device of claim 21, wherein the first electrode layer includes an ITO layer between the plurality of metal layers and the surface modification layer.

* * * * *